(12) United States Patent
Brodoceanu et al.

(10) Patent No.: US 10,998,286 B1
(45) Date of Patent: May 4, 2021

(54) LASER-INDUCED SELECTIVE HEATING FOR MICROLED PLACEMENT AND BONDING

(71) Applicant: Facebook Technologies, LLC, Menlo Park, CA (US)

(72) Inventors: Daniel Brodoceanu, Saarbrucken (DE); Allan Pourchet, Cork (IE); Oscar Torrents Abad, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/892,336

(22) Filed: Feb. 8, 2018

(51) Int. Cl.
| | | |
|---|---|---|
| *H01L 33/62* | (2010.01) |
| *H01L 33/40* | (2010.01) |
| *H01L 25/075* | (2006.01) |
| *H01L 23/00* | (2006.01) |
| *H01L 33/30* | (2010.01) |
| *H01L 33/32* | (2010.01) |

(52) U.S. Cl.
CPC .............. *H01L 24/80* (2013.01); *H01L 24/05* (2013.01); *H01L 25/0753* (2013.01); *H01L 33/30* (2013.01); *H01L 33/405* (2013.01); *H01L 33/62* (2013.01); *H01L 33/32* (2013.01); *H01L 2224/05611* (2013.01); *H01L 2224/05647* (2013.01); *H01L 2224/80121* (2013.01); *H01L 2224/80224* (2013.01); *H01L 2924/1033* (2013.01); *H01L 2924/10329* (2013.01); *H01L 2924/10331* (2013.01); *H01L 2933/0016* (2013.01); *H01L 2933/0066* (2013.01)

(58) Field of Classification Search
CPC ....... H01L 24/80; H01L 33/405; H01L 33/62; H01L 33/30; H01L 25/0753; H01L 24/05; H01L 2933/0016; H01L 2924/10331; H01L 2224/05611; H01L 2933/0066; H01L 33/32; H01L 2924/1033; H01L 2224/05647; H01L 2224/80224; H01L 2924/10329; H01L 2224/80121
See application file for complete search history.

(56) References Cited

U.S. PATENT DOCUMENTS

| | | | | |
|---|---|---|---|---|
| 2013/0036928 | A1* | 2/2013 | Rogers | B41F 16/00 101/483 |
| 2016/0368110 | A1* | 12/2016 | Lu | B23Q 15/14 |
| 2017/0358503 | A1* | 12/2017 | Liu | H01L 27/1248 |
| 2018/0114878 | A1* | 4/2018 | Danesh | H01L 33/0095 |
| 2018/0342407 | A1* | 11/2018 | Chen | B41J 2/1631 |

\* cited by examiner

*Primary Examiner* — Benjamin Tzu-Hung Liu
(74) *Attorney, Agent, or Firm* — Fenwick & West LLP

(57) ABSTRACT

A laser is used to induce bonding of LED contact pads with corresponding substrate contact pads on a display substrate. The wavelength of the laser light and the material used for the contact pads are both selected so that the laser light is capable of melting the contact pads. For example, the laser light has a wavelength of between 220 nm and 1200 nm, and the contact pads are formed of a copper-tin oxide (CuSn). Furthermore, the system may be configured to shine the laser light through a number of other components, such as the pick-up head and the LED itself. These materials can be formed of materials that do not absorb the energy of the laser light. Bonding the contacts with a laser in this manner allows for faster heating and cooling times, avoids reheating of previously bonded contact pads, and reduces thermal expansion of the display substrate.

11 Claims, 6 Drawing Sheets

LASER-INDUCED SELECTIVE HEATING FOR MICROLED PLACEMENT AND BONDING

BACKGROUND

The present disclosure relates to manufacture of electronic displays.

Displays are ubiquitous and are a core component of many wearable electronic devices, smart phones, tablets, laptops, desktops, TVs and display systems. Some example display technologies include Inorganic Light Emitting Diode (ILED) displays and Organic Light Emitting Diode (OLED) displays. Displays can be manufactured by placing LEDs (e.g., red, green, and blue ILEDs) at each pixel using standard manufacturing techniques, such as a pick and place process. However, certain aspects of a conventional pick and place process may be unsuitable for some applications, such as manufacturing smaller displays for use in devices like smartphones or virtual reality headsets.

SUMMARY

Embodiments relate to a system and a process for using a pick and place head (PPH) that picks up semiconductor devices and places the semiconductor devices on a target substrate to induce bonding of semiconductor contact pads on the semiconductor device with substrate contact pads on the target substrate. The process may be used, for example, to bond contact pads on light emitting diodes (LEDs) to corresponding contact pads on a display substrate as part of a manufacturing process for a display device where individual LEDs form the sub-pixels of the display device.

The PPH may include multiple pick-up heads that can selectively pick up multiple LEDs from a carrier substrate to the display substrate. Although the LEDs may be bonded to a display substrate by applying heat to the entire display substrate, this technique is subject to a number of shortcomings. For instance, the heating can lead to thermal expansion of the display substrate, which can cause the LEDs to become misaligned with the corresponding contact pads on the display substrate. In addition, heating the entire display substrate can take a relatively long time, which reduces the overall throughput of the manufacturing process. Furthermore, when LEDs are placed onto the display substrate in multiple placement cycles, reheating the display substrate in each cycle can result in debonding of previously bonded LEDs.

Instead of applying heat to the entire display substrate, a laser emits a laser light that is used to induce bonding of the LED contact pads with the corresponding substrate contact pads. In some embodiments, laser light may be applied through each pick-up head that has an attached LED during placement of LEDs on the display substrate to induce bonding of the LED contact pads. The wavelength of the laser light and the material used for the contact pads are both selected so that the laser light is capable of melting the contact pads without damaging the LED. Furthermore, the system may be configured to shine the laser light through a number of other components, such as the pick-up head and the LED itself. These materials can be formed of materials that do not absorb the energy of the laser light. For instance, the pick-up head is formed of polydimethylsiloxane (PDMS) or fused silica, which is transparent or substantially transparent to light with wavelengths between 220 nm and 1200 nm. Similarly, the LED includes a gallium semiconductor layer formed of gallium nitride (GaN) or gallium arsenide (GaAS), which is transparent or substantially transparent to light with wavelengths greater than the wavelength of the light emitted by the LED.

In one embodiment, the wavelength of the laser light is selected so that the laser light passes through both the pick-up head and the LED to be directly absorbed by the contact pads to heat the contact pads and induce bonding. For example, the laser light has a wavelength that is less than 1200 nm (to pass through the pick-up head) and greater than the wavelength of the light emitted by the LED.

In another embodiment, the wavelength of the laser light is selected so that LED absorbs the laser light and converts the laser light into heat. In this embodiment, the laser light passes through the pick-up head to be absorbed by the LED, and the heat is transferred (e.g., by conduction) from the LED to the contact pads to induce bonding. For example, the LED includes a layer of gallium nitride (GaN), and the laser light has a wavelength of greater than 220 nm and less than 360 nm, which causes the laser light to be absorbed by a 100 nm-thick portion of the GaN layer.

Bonding the LED contact pads with the substrate contact pads in this manner has several advantages. For instance, heating contact pads with the laser light allows for faster heating and cooling times, which reduces the time taken to bond LEDs to the display substrate. In addition, the process reduces the growth of metal oxides, such as tin oxide or copper oxide, which may otherwise negatively affect the bonding process. Furthermore, the laser light can be focused to a spot size of a few microns (μm) (approximately the size of a single LED or the size of a single contact pad), which allows heat to be applied to a small area of the display substrate. As a result, this laser-induced bonding process avoids reheating of previously bonded contact pads and reduces thermal expansion of the display substrate.

BRIEF DESCRIPTION OF THE DRAWINGS

Figure (FIG. 1 is a cross-sectional diagram of a μLED, in accordance with one embodiment.

The figures depict embodiments of the present disclosure for purposes of illustration only.

DETAILED DESCRIPTION

Embodiments relate to a system and a process for using a laser to induce bonding of contact pads of a semiconductor device (e.g., an LED die) with contact pads on a target substrate. A pick and place head (PPH) that includes one or more pick-up heads aligns contact pads of one or more LED dies with contact pads on the target substrate. The LED dies are then placed on the target substrate by lowering the pick-up head. After the semiconductor devices are placed, a laser transmits a laser light to induce bonding of the LED contact pads with the corresponding substrate contact pads on the display substrate. The wavelength of the laser light and the material used for the LED contact pads are both selected so that the laser light is capable of melting the contact pads, either directly or indirectly, and induce bonding. Furthermore, the system may be configured to shine the laser light through a number of other components, such as the pick-up head and the LED itself. These materials can be formed of materials that do not absorb the energy of the laser. For instance, the pick-up heads are formed of PDMS or fused silica, and the LED is formed of gallium nitride (GaN).

MicroLED Structure

Figure 1:
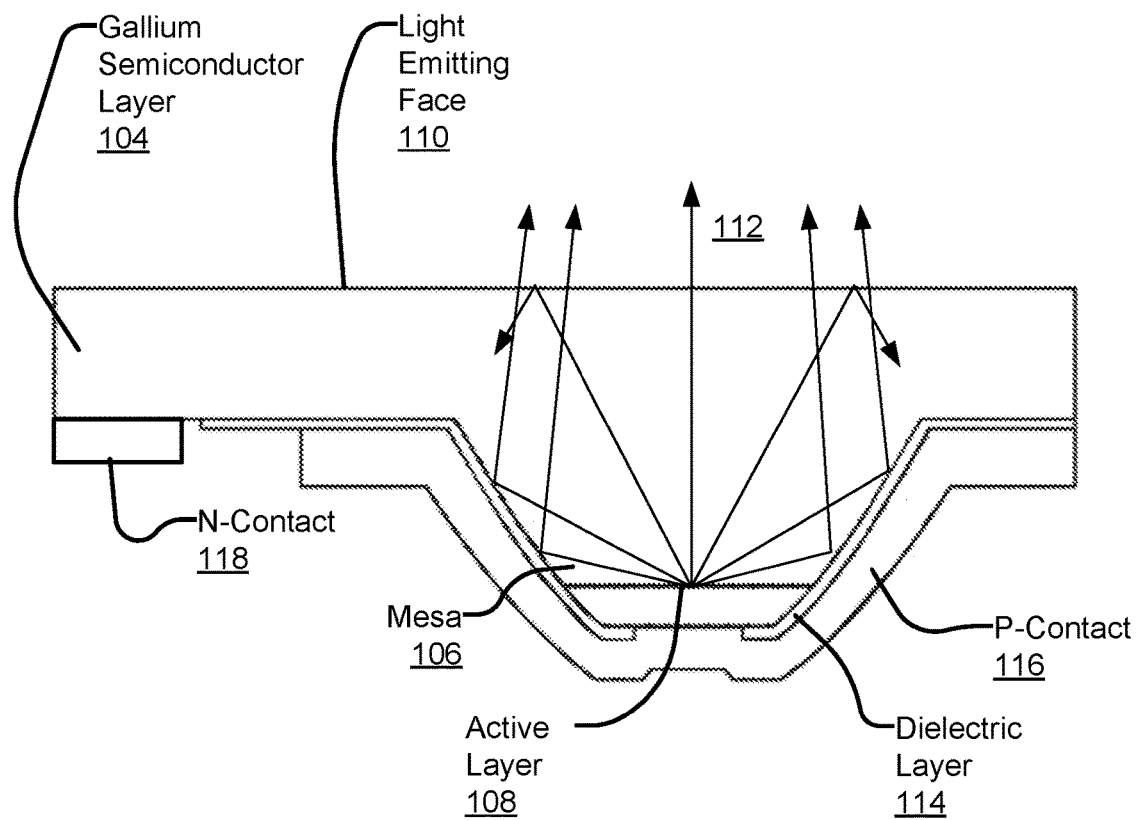

FIG. 1 is a cross sectional diagram illustrating a μLED 100, in accordance with one embodiment. The μLED 100 is an example of a LED that may be positioned on a surface of a display substrate (e.g., the target substrate 218 shown in FIGS. 2A-2B) to emit collimated visible or invisible light.

The μLED 100 is formed on a substrate layer (not shown in FIG. 1) and includes, among others components, a gallium semiconductor layer 104 that is grown on the substrate layer, a dielectric layer 114 disposed on the gallium semiconductor layer 104, a p-contact 116 disposed on a first portion of the dielectric layer 114, and an n-contact 118 disposed on a second portion of the gallium semiconductor layer 104. The p-contact 116 and the n-contact 118 (hereinafter referred to collectively as LED contact pads) serve as interconnects for the μLED 100 when the μLED 100 is mounted to a display substrate. In some embodiments, the gallium semiconductor layer 104 is grown on the substrate layer as an epitaxial layer. The gallium semiconductor layer may be formed of a semiconductor material such as gallium nitride (GaN), gallium phosphide (GaP), or gallium arsenide (GaAs).

The μLED 100 may be less than 20 μm in diameter with a parabolic structure etched onto the LED die during wafer processing to form a quasi-collimated light beam emerging from the light emitting face 110. The μLED 100 includes high light extraction efficiency and outputs quasi-collimated light because of its shape.

In some embodiments, the gallium semiconductor layer 104 is shaped into a mesa 106. An active (or light emitting) layer 108 (or "active light emitting area") is included in the structure of the mesa 106. The mesa 106 has a truncated top, on a side opposed to the light emitting face 110. The mesa 106 also has a curved or near-parabolic shape to form a reflective enclosure for light within the μLED 100. The arrows 112 show how light emitted from the active layer 108 is reflected off the walls of the mesa 106 toward the light emitting face 110 at an angle sufficient for the light to escape the μLED 100 (e.g., within the angle of total internal reflection).

This structure of the μLED 100 results in an increase in the efficiency of light emission when compared to unshaped or standard LED chips. As such, the μLED 100 produces light visible to the human eye with reduced current (e.g., nano-amps of drive current). Additional details regarding μLEDs, applicable in some embodiments, are discussed in U.S. Pat. No. 7,518,149, which is incorporated by reference herein in its entirety. The μLED 100 is an example of a LED die, although other types of LED dies may also be assembled into a display as discussed herein.

System for LED Display Fabrication

Figure 2A:
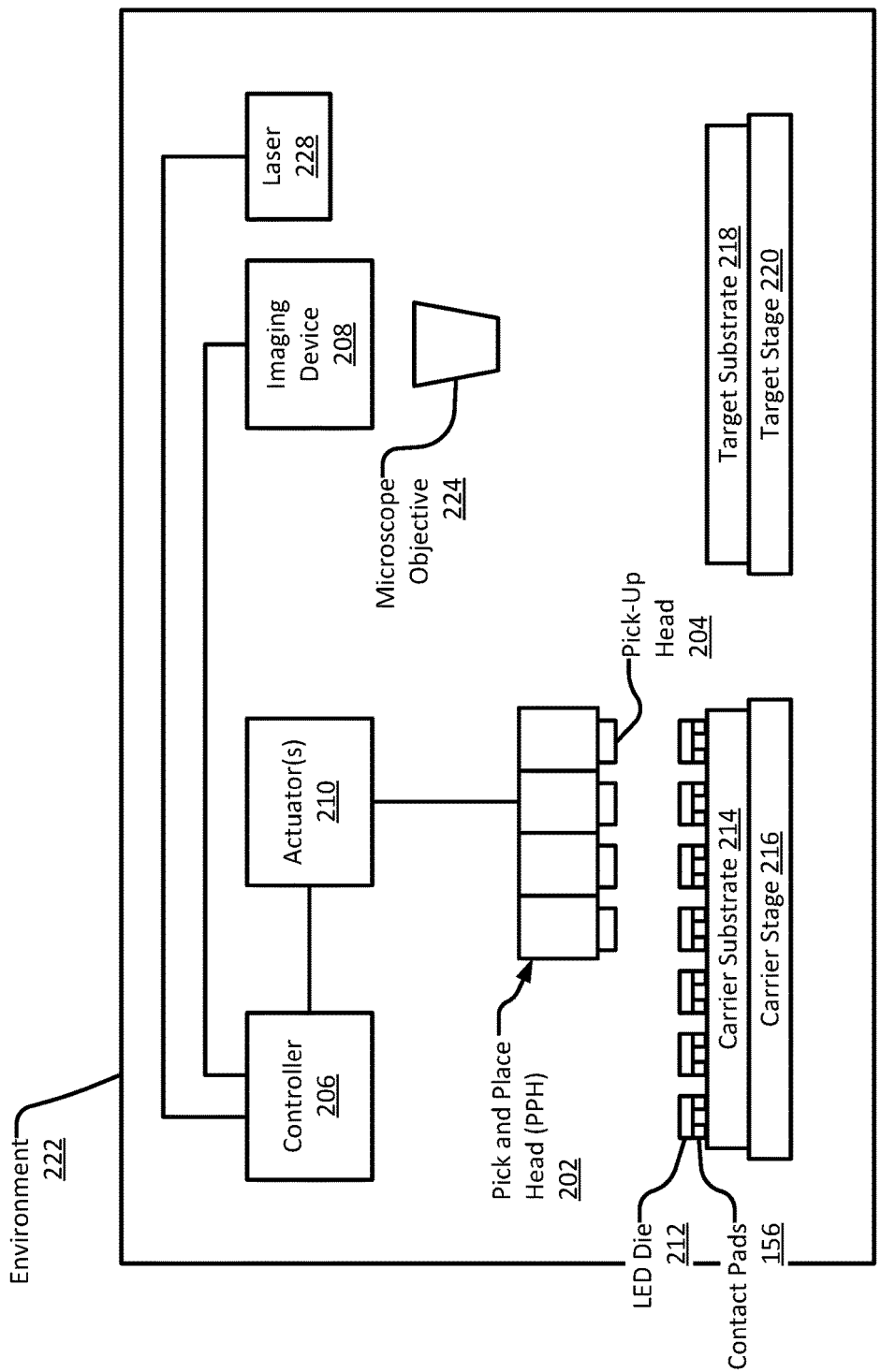
FIGS. 2A-2B are system diagrams of a display assembly system, in accordance with one embodiment.
Figure 2B:
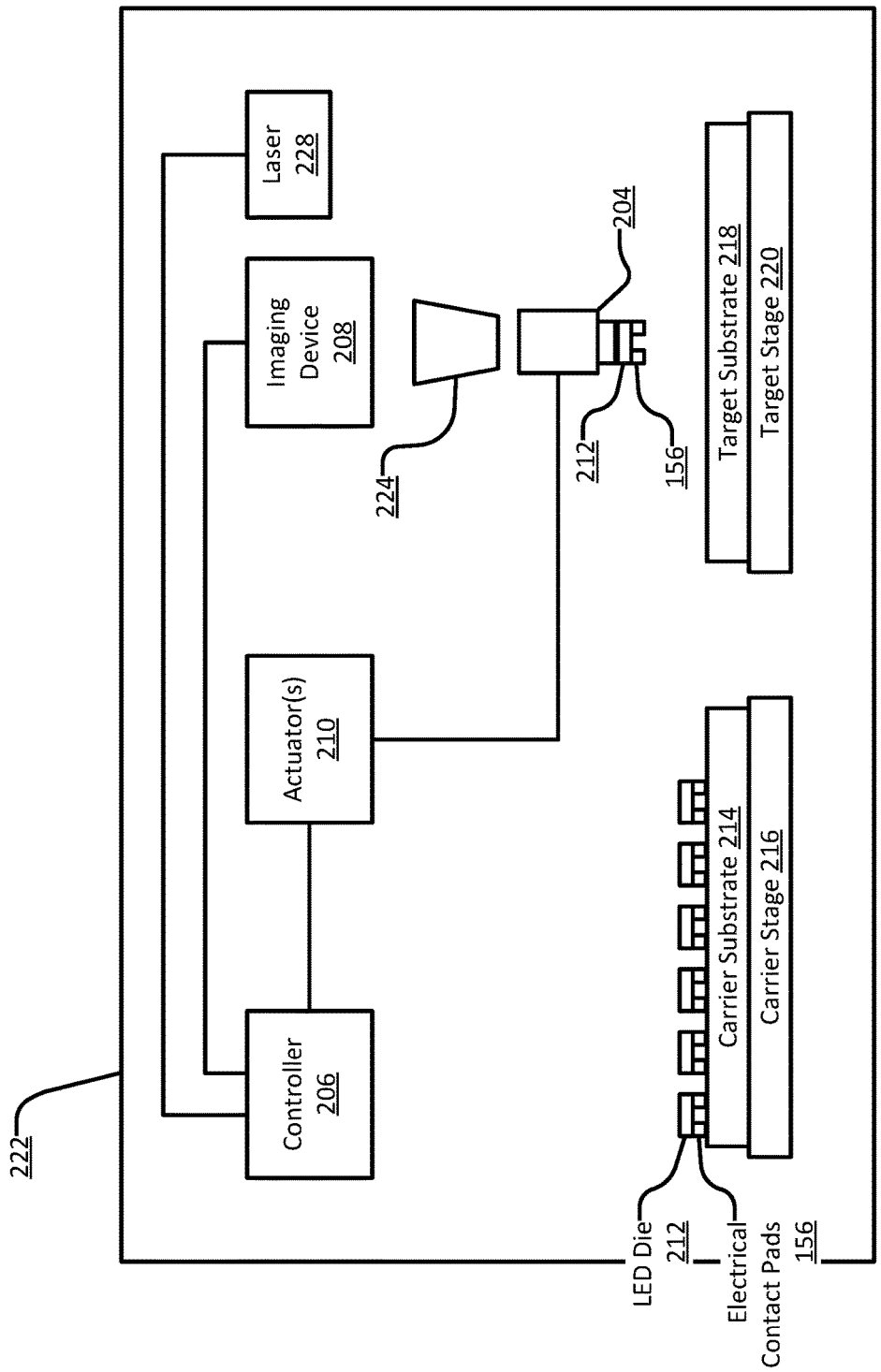

FIGS. 2A and 2B are system diagrams of a display assembly system 200, in accordance with some embodiments. The system 200 fabricates a display device by assembling LED dies 212 onto a target substrate 218. In some embodiments, the target substrate 218 is a display substrate. For example, different color LED dies 212 may be placed at pixel locations of the target substrate 218, and then bonded to the substrate 218. The system 200 may include, among other things, an environment 222 for picking and placing LED dies 212. In the embodiment shown in FIGS. 2A and 2B, the system 200 includes a pick and place head (PPH) 202, a controller 206, an imaging device 208, actuator(s) 210, a microscope objective 224, and a laser 228 located within the environment 222. The system 200 further includes a carrier stages 216 and a target stage 220. In some embodiments, the environment 222 is an interior environment of an SEM chamber and the imaging device 208 is a scanning electron microscope (SEM).

In some embodiments, the PPH 202 includes an array of pick-up heads 204. Each of the pick-up heads 204 may be selectively activated to pick up an LED die 212 and place the LED die 212 on the target substrate 202. In other embodiments, the PPH 202 may include a single pick-up head 204.

Referring first to FIG. 2A, illustrated is the system 200 before the PPH picks up one or more of the LED dies 212 from the carrier substrate 214 to place onto the target substrate 218. Although the system 200 is discussed as being configured to assemble LED dies 212 on the display substrate 218, the system 200 may be used to assemble other types of semiconductor devices on other types of target substrates. For example, the semiconductor devices may include photodiodes or vertical-cavity surface-emitting lasers (VCSELs). The semiconductor devices may include an elastomeric layer that facilitates attachment of the semiconductor devices with the pick-up surfaces of the PPH 202. The one or more actuator(s) 210 are connected to the PPH 202 and controls movement of the PPH 202. For example, the actuator(s) 210 may facilitate movement in multiple degrees of freedom, such as four degrees of freedom capable of moving the PPH up and down, left and right, and forward and back, and further capable of rotating the PPH 202. The actuator(s) 210 are connected with the controller 206. The controller 206 controls the PPH 202 by controlling the actuator(s) 210.

The imaging device 208 facilitates a visual alignment of LED die pick-up from the carrier substrate 214 and also facilitates visual alignment of LED die placement on the target substrate 218. For example, the imaging device 208 generates images of the PPH 202 and the carrier substrate 214, and provides the images to the controller 206. The controller 206 aligns the PPH 202 with the carrier substrate 214 based on the images, and picks up arrays of LED dies by lowering the aligned PPH 202 onto one or more of the LED dies 212 mounted on the carrier substrate 214. In another example, the imaging device 208 generates images of the PPH 202 and the target substrate 218, provides the images to the controller 206, and the controller aligns the PPH 202 with the target substrate 2318 based on the images. In some embodiments, the imaging device 208 generates the images by capturing the images through the microscope objective 224, which is an optical component that includes one or more lenses or other optical elements.

The controller 206 aligns the PPH 202 with the target substrate 218 based on the images, and places the LED dies attached with the PPH 202 on the target substrate 218. In some embodiments, the imaging device 208 is an environmental scanning electron microscope (ESEM) to provide images without specimen coating. In these embodiments, the environment 222 is defined by an ESEM chamber including a high pressure atmosphere of water vapor. The use of an SEM is advantageous for picking and place small LED dies. In various embodiments, other types of imaging devices may be used to facilitate the alignments.

The carrier stage 216 holds the carrier substrate 214. The carrier substrate 214 is mounted with LED dies 212. In embodiments where the LED dies 212 include an elastomeric layer, the LED dies 212 are mounted on the carrier substrate 214 with the elastomeric layer facing up to facilitate adhesive pick up of the LED dies 212 by the PPH 202. In other embodiments, the PPH 202 picks up the LED dies 212 by some other method other adhesion, such as suction force, electromagnetic force, fluidic membranes, etc. As discussed above, the system 200 is not limited to picking and placing LED dies 212, and may be used with other types of semiconductor devices.

In some embodiments, the carrier stage 216 and/or the target stage 220 may be adjusted to facilitate precision alignment with the PPH 202. For example, the carrier stage 216 and/or the target stage 220 may include three degrees of freedom. The degrees of freedom may include left and right, backward and forward, and a yaw rotational degree of freedom. The carrier substrate 214 is moved with the carrier stage 216, and the target substrate 218 is moved with the target stage 220.

The target stage 220 holds a target substrate 218 for LED placement, such as a display substrate. Referring now to FIG. 2B, illustrated is the system 220 after a pick-up head 204 of the PPH 202 picks up a LED die 212 from the carrier substrate 214 and before the pick-up head 204 places the LED die on the target substrate 218. A single pick-up head 204 is shown in FIG. 2B to avoid overcomplicating the disclosure, although the pick-up head 204 may be part of an array of pick-up heads 204 that form the PPH 202 as discussed above. Although a single carrier substrate 214 is shown in FIGS. 2A and 2B, the system 200 may include one or more carrier substrates 214. For example, different carrier substrates 214 may carry different color LED dies. A carrier substrate 214 may be native substrate on which the LED dies 212 are fabricated, or may be an intermediate carrier substrate to facilitate LED die transfer between a native substrate and the display substrate 218.

After the PPH 202 places the LED dies 212 on the display substrate, the controller 206 activates the laser 228 to heat the LED contact pads 156 in order to thermally bond the LED contact pads 156 to substrate contact pads on the target substrate 218. In some embodiments, a laser 228 activated multiple times in a placement cycle of the LED dies 212 for bonding of multiple LED dies 212. In other embodiments, each pick-up head 204 may include a dedicated laser 228. Additional lasers 228 may be used to support parallel bonding of multiple LED dies 212 to the target substrate 218. The manner in which the laser 228 is operated to thermally bond the LED contact pads 156 to the substrate contact pads is described below in further detail with reference to FIGS. 3A, 3B, and 4.

Laser-Induced Selective Heating for Bonding of LEDs

Figure 3A:
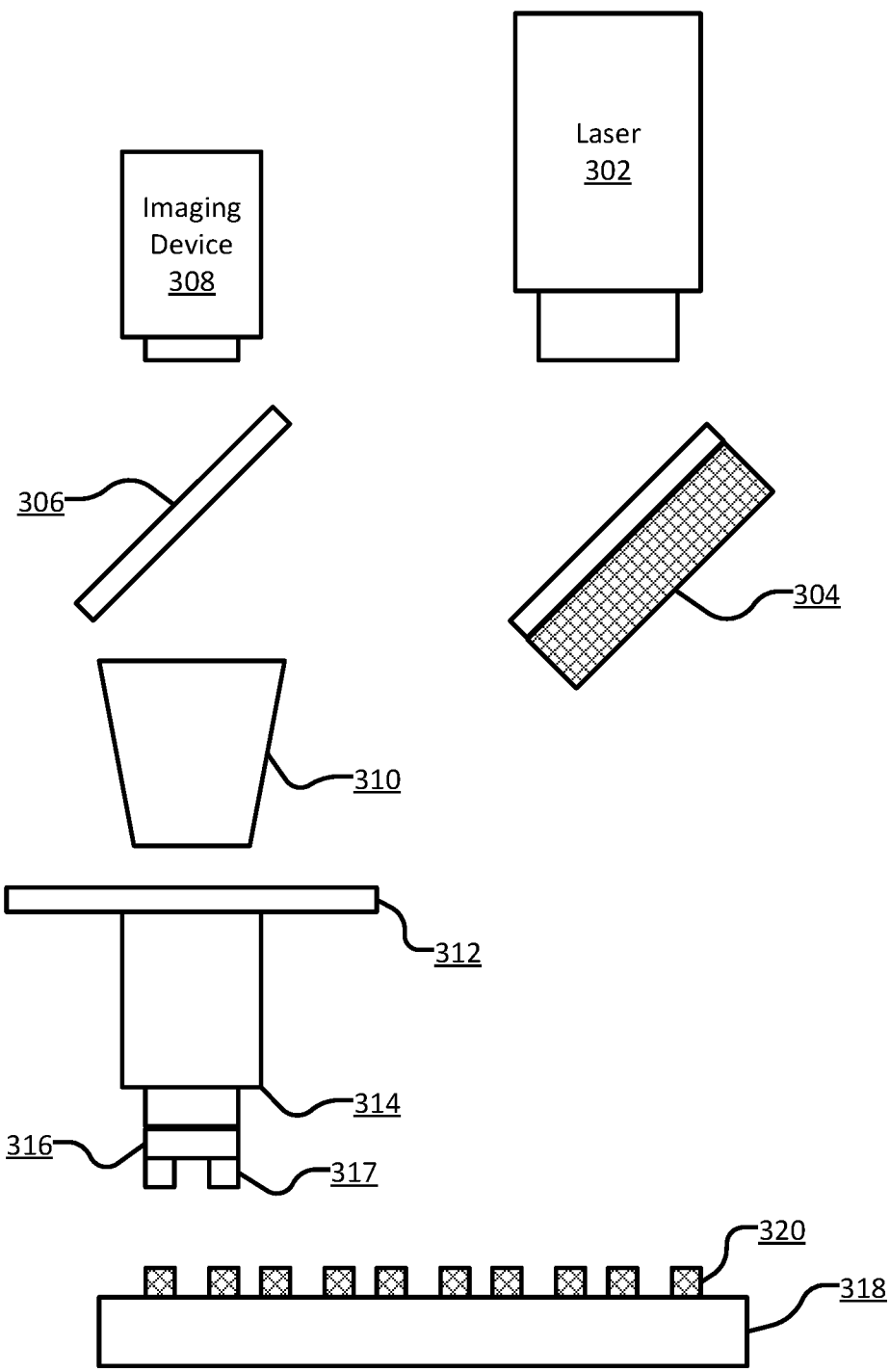
FIGS. 3A-3B are diagrams illustrating laser-induced selective heating of LEDs to bond electrical contacts, in accordance with one embodiment.
Figure 3B:
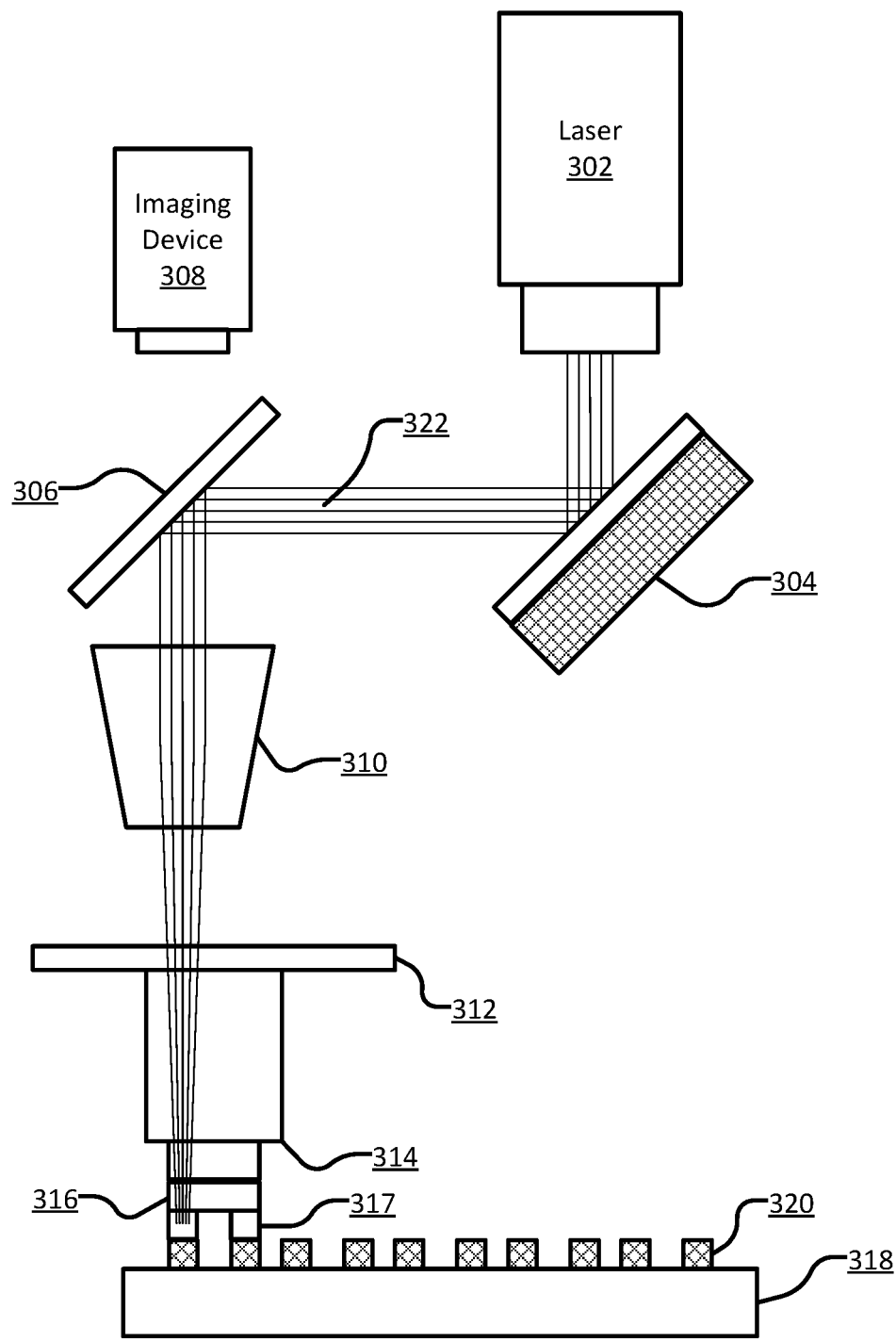

FIGS. 3A-3B are diagrams illustrating a system 300 for laser-induced selective heating of LEDs to bond electrical contacts, in accordance with one embodiment. The system 300 includes a laser 302, an actuated mirror 304, a dichroic mirror 306, an imaging device 308, a microscope objective 310, an actuated glass slide 312, a pick-up head 314, a μLED 316, and a target substrate 318. The μLED 316 includes two LED contact pads 317 (e.g., the n-contact 118 and p-contact 116 of the μLED 100), and the target substrate 318 includes a plurality of substrate contact pads 320. The system 300 shown in FIGS. 3A and 3B may be part of the display assembly system 200 shown in FIGS. 2A and 2B. For example, the laser 302 corresponds to the laser 228, the imaging device 308 corresponds to the imaging device 208, the microscope objective 310 corresponds to the microscope objective 224, the pick-up head 314 corresponds to the PPH 202, the μLED 316 corresponds to the LED dies 212, the LED contact pads 317 correspond to the LED contact pads 156, and the target substrate 318 corresponds to the target substrate 218.

Referring first to FIG. 3A, illustrated is the system 300 after the pick-up head 314 has picked up one or more μLEDs 316 from the carrier substrate and before the μLEDs 316 have been placed on the target substrate 218. For ease of illustration, the pick-up head 314 shown in FIGS. 3A and 3B is depicted as picking up and placing a single μLED 316. However, the pick-up head 314 may be part of a PPH including multiple pick-up heads that picks up and places multiple μLEDs 316 at once. For example, the pick-up head 314 may be part of a PPH 202 configured to pick up and place a row of μLEDs 316 or a two-dimensional array of μLEDs 316.

The laser 302 is a device capable of emitting a laser light suitable for heating the LED contact pads 317 and/or the substrate contact pads 320 in order the bond the contact pads 317, 320 to each other. In one embodiment, the laser 302 is a continuous wave (CW) laser. In another embodiment, the laser 302 is a pulsed laser. The laser 302 emits a laser light at a wavelength that is absorbed by the LED contact pads 317. For example, in one embodiment the laser 302 emits a laser light at a wavelength of between 220 nm and 1200 nm. In this embodiment, the LED contact pads 317 may be formed of a copper-tin alloy (CuSn) because electromagnetic radiation having a wavelength in this range is adsorbed by copper-tin alloy (or by the gallium semiconductor layer of the μLED 316), thus causing the alloy to melt and bond the LED contact pads 317 to the substrate contact pads 320. In other embodiments, the LED contact pads 317 are formed of a different material, and the laser 302 may emit a laser light in a different range of wavelengths that is suitable for melting and bonding the LED contact pads 317.

The actuated mirror 304 is a mirror coupled to one or more actuators that can be operated (e.g., by control signals received from the controller 206) to move the mirror in one or more directions. In one embodiment, the actuators facilitate movement of the actuated mirror 304 in two degrees of freedom capable of rotating the actuated mirror about two perpendicular axes. The actuated mirror may be, for example, a piezoelectric actuated mirror that includes a plurality of computer-controlled piezoelectric actuators. As described in further detail below with respect to FIG. 3B, the actuated mirror 304 can be operated to deflect the laser light through the dichroic mirror 306 and the microscope objective 310 in a scanning pattern between multiple pairs of contact pads 317, 320.

The dichroic mirror 306 reflects light in a first range of wavelengths and passes light in a second range of wavelengths. More specifically, the dichroic mirror 306 reflects the laser light emitted by the laser 302 at relatively high reflectivity (i.e., with relatively low or negligible absorption) and passes light that can be detected by the imaging device 308. In one embodiment, the dichroic mirror 306 reflects light at the laser line bandwidth of the laser light (e.g., a band of wavelengths within 10 nm or some other threshold of the laser line wavelength) and passes light in the visible light spectrum (except for light within the laser light bandwidth). For example, if the laser light has a wavelength of 640 nm (i.e., red light), then the dichroic mirror reflects light between 630 nm and 650 nm and passes visible light outside of this band. This allows the imaging device 308 to capture images of the pick-up head 314 and the target substrate 318 through the dichroic mirror 306, microscope objective 310, and pick-up head 314 for alignment purposes while also allowing the laser light to be directed through the microscope objective 310 and the pick-up head 314.

The microscope objective 310 is an optical component that includes one or more lenses or other optical elements. The microscope objective 310 is aligned with the imaging device 308 so that the imaging device 308 can capture images through the microscope objective 310 (and through the dichroic mirror 306, which is positioned between the imaging device 308 and the microscope objective 310). The microscope objective 310 magnifies the image captured by the imaging device, which allows the imaging device 308 to image the μLED 316 at sufficient resolution for the pick-up head 314 to perform the alignment functions described above. In addition, the microscope objective 310 also focuses the laser light emitted by the lase 302 into a smaller spot size, as described in further detail below with respect to FIG. 3B. In one embodiment, the imaging device 308, the dichroic mirror 306, and the microscope objective 310 are integrated into a single imaging system. For example, these three components 306, 308, 310 may be part of a single optical tube.

The pick-up head 314 picks up LED dies 316 from the carrier substrate 214 and places them on the target substrate 218. In one embodiment, the tip of the pick-up head 314 (i.e., the portion that makes contact with the LED dies 316) has as the same dimensions (or substantially similar dimensions) as the LED die 316. In this embodiment, the external walls of the pick-up head 314 may be coated with a reflective metal, which shapes the lateral profile of the laser light to match the shape of the LED die 316.

The pick-up head 314 is mechanically coupled to the actuated glass slide 312, and the actuated glass slide 312 is coupled to actuators (e.g., the actuators 210 shown in FIGS. 2A and 2B) that are controlled by a controller (e.g., the controller 206). The actuators move the glass slide 312, which in turn moves the pick-up head 314. In one embodiment, the actuators can move the glass slide 312 and the pick-up head 314 in six degrees of freedom (i.e., three translational directions and three rotational directions). For example, the glass slide 312 and the actuators form a hexapod system that is capable of controlling the position and orientation of the pick-up head 314 with high accuracy. As described above, the μLED 316 is a light-emitting semiconductor device that includes a gallium semiconductor layer and LED contact pads 317. The μLED 316 may optionally include an epitaxial layer to facilitate attachment to the pick-up head 314.

The target substrate 318 includes a plurality of substrate contact pads 320. Each pair of substrate contact pads 320 is configured to couple to the LED contact pads 317 of a μLED 316. The substrate contact pads are also coupled to traces in the target substrate 318 defining control circuits for the LEDs. In one embodiment, the substrate contact pads and the conductive traces are formed of copper (Cu). Once coupled, the substrate contact pads 320 deliver a signal to the μLED through the LED contact pads 317, which allows signals delivered to the conductive traces to control the μLEDs.

When in operation, the controller receives one or more images of the μLED 316 from the imaging device 308 (e.g., as captured through the dichroic mirror 306 and the microscope objective 310) and moves the pick-up head 314 so that the LED contact pads 317 are aligned with the substrate contact pads 320. After the contact pads 317, 320 are aligned, the pick-up head 314 is lowered, and the laser 302 is activated to heat up the contact pads 317, 320.

Referring next to FIG. 3B, illustrated is the system 300 after the pick-up head 314 has aligned the μLEDs 316 with the substrate contact pads 320 and placed the μLEDs 316 onto the target substrate 318. As shown in FIG. 3B, the laser 302 is activated (e.g., via an activation signal sent from the controller) after the μLEDs 316 are aligned and placed. In the embodiment shown in FIGS. 3A and 3B, the laser light 322 emitted by the laser 302 is reflected off the actuated mirror 304 and the dichroic mirror 306, and then passes through the microscope objective 310. As shown in FIG. 3B, the microscope objective 310 focuses the laser light 322, so the laser light 322 converges to a smaller point after exiting the microscope objective 310. In one embodiment, the optical elements in the microscope object 310 focus the laser light 322 to a point that has approximately the same width as one of the contact pads 317, 320, which allows the energy of the laser light 322 to be applied to a single pair of contact pads 317, 320 at a time.

After exiting the microscope objective, the laser light 322 travels through actuated glass slide 312 and the pick-up head 314 prior to reaching the μLED 316. These components may be formed of materials that do not absorb electromagnetic radiation in the wavelengths emitted by the laser 302 (e.g., wavelengths between 380 nm and 1200 nm) and are resistant to temperatures of up to 300° C. In one embodiment, the actuated glass slide 312 is formed of glass and the pick-up head 314 may be formed of PDMS or fused silica. In other embodiments, one or both of these components 312, 314 are formed of a different material that is both transparent or substantially transparent to wavelengths between 380 nm and 1200 nm and resistant to temperatures of up to 300° C.

In the embodiment shown in FIGS. 3A and 3B, the laser light 322 approaches the contact pads 317, 320 in a direction perpendicular to the plane of the target substrate 318. In other embodiments, the laser 302 is positioned so that the laser light 322 approaches the contact pads 317 from a different direction. In one embodiment, the laser light 322 may be oriented at an angle relative to a direction perpendicular to the plane of the target substrate 318 so that the laser light 322 does not pass through one or both of the pick-up head 314 and the μLED 316. In this embodiment, the pick-up head 314 and/or the μLED 316 may be formed of different materials. In another embodiment, the laser 302 is positioned below the target substrate 318 (i.e., on the side opposite to the pick-up head 314) and the laser light 322 passes through the target substrate 318 before reaching the contact pads 317, 320.

In the embodiment shown in FIG. 3B, the laser light 322 passes through the μLED 316 without being absorbed and directly heats the contact pads 317, 320. For instance, the μLED 316 may be formed of a semiconductor, such as gallium nitride (GaN) or gallium arsenide (GaAn), which is transparent or substantially transparent to electromagnetic radiation in wavelengths greater than the wavelength of the light emitted by the μLED 316 (e.g., greater than 640 nm for a GaAs LED that emits red light, greater than 530 nm for a GaN LED that emits green light, greater than 460 nm for a GaN LED that emits blue light) and absorbs wavelengths less than the wavelength of the emitted light. In this case, the wavelength of the laser light is selected to be greater than the wavelength emitted by the μLED 316 and less than 1200 nm so that both the pick-up head 314 and the μLED 316 are substantially transparent to the laser light 322. In embodiments where the μLED 316 or pick-up head 314 includes an elastomeric layer to facilitate adhesive pick-up, the elastomeric layer is also formed of a material that is transparent or substantially transparent to the laser light 322.

When the laser light 322 travels through the contact pads 317, 320, the contact pads 317, 320 absorb the energy of the laser light 322, which causes the contact pads 317, 320 to heat up and bond with each other. This laser-induced bonding forms both a mechanical connection that fixes the μLED 316 in place on the target substrate 318 and an electrical connection that allows signals to be sent to the μLED 316 via the bonded contact pads 317, 320.

In one embodiment, the LED contact pads 317 may be formed of a copper-tin alloy (CuSn) while the substrate contact pads are formed of copper (Cu). Because electromagnetic radiation between 460 nm and 1200 nm (i.e., the range of wavelengths that is transparent to both the pick-up head 314 and the μLED 316) is adsorbed by copper-tin alloy, the laser light 322 causes the tin to melt and bond the LED contact pads 317 to the substrate contact pads 320.

In another embodiment, the laser light 322 is absorbed by the μLED 316. In this embodiment, the μLED 316 converts the laser light 322 into heat and the heat is transferred (e.g., by conduction) from the μLED 316 to the LED contact pads 317 to bond the LED contact pads 317 to the substrate contact pads 320. In this embodiment, the wavelength of the laser light 322 is selected so that the μLED 316 absorbs the laser light 322. As noted above, a semiconductor such as gallium nitride (GaN) or gallium arsenide (GaAn) absorbs wavelengths less than the wavelength of the emitted light. Thus, in this embodiment, the wavelength of the laser light 322 is less than the wavelength of the emitted light and greater than 220 nm (so that the laser light 322 can still pass through the pick-up head 314 without being absorbed). For example, the μLED 316 includes a layer of gallium nitride (GaN) and emits blue light, and the laser light 322 has a wavelength of greater than 220 nm and less than 360 nm, which causes the laser light to be absorbed by a 100 nm-thick portion of the GaN layer.

As noted above, in some embodiments the pick-up head 314 picks up and places a plurality of μLEDs 316 at once. The laser light 322 can be focused into a spot size that has approximately the same size as one of the contact pads 317, 320 or one of the μLEDs 316 (e.g., a few microns (μall) wide). For example, in embodiments where the actuated mirror 304 is flat (or substantially flat), the spot size may have a substantially circular shape and a diameter of 3 μm, 4 μm, 5 μm, or some other diameter. In other embodiments, the actuated mirror 304 has a linearly curved shape, which causes the spot size to be linearly shaped. The actuated mirror 304 can then be operated (e.g., via control signals from the controller) to deflect the laser light 322 through the microscope objective 310 so that the laser light 322 performs a scanning pattern on the plurality of μLEDs 316 to bond the LED contact pads 317 of each μLED 316 to the corresponding substrate contact pads 320. In one embodiment, the actuated mirror 304 is capable of performing several different scanning patterns in order to improve the bonding quality while reducing the risk of damage to the μLED 316 caused by stress due to thermal expansion. For example, the system can focus the laser light 322 to a spot size that is approximately the same size as one of the contact pads 317, 320 and then control the actuated mirror 304 to scan the contact pads 317, 320 in a scanning pattern (e.g., moving along the contact pads 317, 320 line by line or in a zig-zag pattern) to bond successive pairs of contact pads 317, 320. Because the spot size matches the size of the contact pads 317, 320, portions of the LED beyond the spot size are not exposed to the laser light, which reduces the area of the LED that is exposed to the laser light and thus reduces the amount of thermal expansion.

After the LED contact pads 317 of each μLED 316 have been bonded to the corresponding substrate contact pads 320, the controller raises the pick-up head 314. Because the bonding process forms a mechanical connection that fixes the μLEDs 316 in place, the μLEDs 316 remain in place on the target substrate 318 when the pick-up head 314 is raised.

Figure 4:
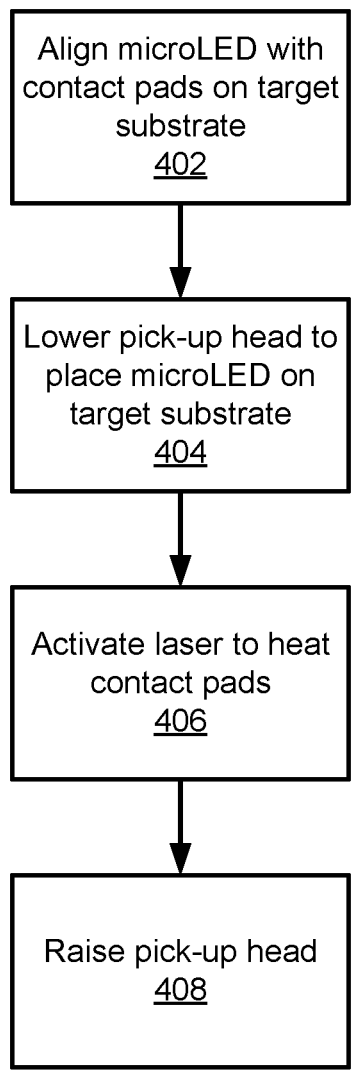
FIG. 4 is a flow chart illustrating a process for performing selective heating with a laser light to bond electrical contacts, in accordance with one embodiment.

FIG. 4 is a flow chart illustrating a process 400 for performing selective heating with a laser to bond electrical contacts, in accordance with one embodiment. The process 400 shown in FIG. 4 takes place after the pick-up head has already picked up one or more μLEDs from a carrier substrate.

The controller aligns 402 the one or more μLEDs on the pick-up head with the substrate contact pads on the target substrate. In one embodiment, the controller performed the alignment based on images captured by the imaging device. For example, the imaging device 308 captures images of the pick-up head and the target substrate by capturing light that has passed through the dichroic mirror and the microscope objective. After the images are captured, the controller receives the images from the imaging device and operates actuators to move the actuated glass slide so that the μLEDs are aligned. After aligning 402 the μLEDs, the controller lowers 404 the pick-up head to place the μLEDs on the target substrate. Because the μLEDs have been aligned, the LED contact pads on the μLEDs are in physical contact with the corresponding substrate contact pads after the pick-up head is lowered.

The controller activates 406 the laser to heat the contact pads. For example, in the embodiment shown in FIGS. 3A and 3B, the laser light 322 is reflected off the actuated mirror 304 and the dichroic mirror 306 and then passes through the microscope objective 310, the pick-up head 314, and the μLED 316 before reaching the contact pads 317, 320. Because the pick-up head 314 and the gallium semiconductor layer of the μLED 316 do not absorb the energy of the laser light 322, the laser light 322 passes through these components and is instead absorbed by the contact pads 317, 320. In one embodiment, the LED contact pads 317 are formed of a copper-tin alloy and the substrate contact pads 320 are formed of copper, and the laser light 322 heats the contact pads 317, 320 to a temperature of approximately 270° C. This causes the tin in the LED contact pads 317 to melt, which bonds the LED contact pads 317 to the substrate contact pads 320.

In one embodiment, the controller can perform thermos compressive (TC) bonding by causing the pick-up head 314 to apply a force (e.g., by operating the actuators) that presses the μLED 316 against the target substrate 318 while the laser is activated. Applying force with the pick-up head 314 during the operation of the laser results in the simultaneous application of heat and force to the contact pads, which can result in a more effective bond than applying heat alone.

After the μLEDs are bonded, the controller raises 408 the pick-up head (e.g., by operating the actuators to move the actuated glass slide). The μLEDs remain on the target substrate because the mechanical connection formed by the laser-induced bonding process is stronger than the adhesion force (e.g., from an elastomeric layer) that held the μLEDs to the pick-up head. The controller can then move the pick-up head back to the carrier substrate to pick up one or more additional μLEDs, and the process 400 can be repeated to bond the additional LEDs to the target substrate.

Additional Configuration Considerations

As used herein, the terms substantially and approximately indicate that a quantity does not differ from a fixed value by more than a threshold value. The threshold value may be defined as a percentage deviation from the fixed value or a numerical deviation that is measured in the same units as the fixed value. For example, when a spot size for the laser light is described has having approximately the same size as a contact pad, then a dimension of the spot size (e.g., the diameter of the spot size) does not differ from a dimension of the contact pad (e.g., the length or width of the contact pad) by more than a threshold percentage (e.g., 10%) or a threshold length (e.g., 0.5 µm). As another example, when a material is described as being substantially transparent to light in a certain range of wavelengths, then the absorption of the material when exposed to light having a wavelength in the specified range does not exceed a threshold value (e.g., 1%).

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   picking up, with a pick-up head, a semiconductor device of a plurality of semiconductor devices mounted on a carrier substrate, the pick-up head separating the semiconductor device from the carrier substrate, the pick-up head selectively picking up only a subset of the plurality of semiconductor devices mounted on the carrier substrate;
   placing the semiconductor device on a target substrate with the pick-up head, the semiconductor device comprising a semiconductor layer that emits light and semiconductor contact pads that are aligned with contact pads of the target substrate, the semiconductor contact pads being aligned with the contact pads of the target substrate using light passed through a microscope objective and captured by an imaging device; and
   transmitting a laser light through the microscope objective, the pick-up head and the semiconductor layer of the semiconductor device to heat the semiconductor contact pads, the laser light being absorbed by the semiconductor contact pads to bond the semiconductor contact pads with the contact pads of the target substrate, the microscope objective focusing the laser light transmitted through the microscope objective.

2. The method of claim 1, wherein the target substrate is a display substrate and the semiconductor devices are light emitting diode (LED) dies, and wherein the semiconductor contact pads are LED contact pads.

3. The method of claim 2, wherein the laser light is a continuous wave (CW) laser light having a wavelength of between 220 nanometers (nm) and 1200 nm.

4. The method of claim 3, wherein the LED contact pads are formed of a copper-tin alloy.

5. The method of claim 3, wherein the pick-up head is formed of a material selected from a group consisting of polydimethylsiloxane (PDMS) and fused silica.

6. The method of claim 3, wherein the laser light is transmitted through the LED die, and wherein the LED die comprises a gallium semiconductor layer formed of gallium nitride.

7. The method of claim 1, further comprising:
   aligning the pick-up head so that each semiconductor pad of the semiconductor device is aligned with a respective substrate contact pad; and
   after transmitting the laser light, moving the pick-up head away from the target substrate to separate the semiconductor device from the pick-up head.

8. The method of claim 7, further comprising capturing one or more images of the pick-up head and the target substrate with the imaging device, wherein aligning the pick-up head with the target substrate is performed based on the images, wherein the laser light is reflected off of a dichroic mirror prior to being absorbed by the semiconductor contact pads, wherein the dichroic mirror passes wavelengths associated with the imaging device, and wherein the imaging device captures the one or more images through the dichroic mirror.

9. The method of claim 1, wherein the laser light is reflected off an actuated mirror, and further comprising:
   controlling the actuated mirror so that the laser light performs a scanning pattern that heats a plurality of semiconductor contact pads in succession, the plurality of semiconductor contact pads corresponding to two or more different semiconductor devices.

10. The method of claim 9, wherein the plurality of semiconductor pads include semiconductor pads of two or more different semiconductor devices.

11. The method of claim 9, wherein the laser light is focused to a spot size having approximately a size of the semiconductor contact pads by the microscope objective.

* * * * *